United States Patent [19]

Extance et al.

[11] Patent Number: 4,697,146
[45] Date of Patent: Sep. 29, 1987

[54] SPHERICAL SHELL FIBRE OPTIC MAGNETIC FIELD SENSORS AND MAGNETOMETERS AND MAGNETIC GRADIENT DETECTORS INCORPORATING THEM

[75] Inventors: Philip Extance, Shirley; Roger E. Jones, Little Shelford, both of England

[73] Assignee: STC, plc, London, England

[21] Appl. No.: 827,452

[22] Filed: Feb. 10, 1986

[30] Foreign Application Priority Data

Feb. 23, 1985 [GB] United Kingdom ................. 8504731

[51] Int. Cl.⁴ ..................... G01R 33/032; G02B 6/02; G02F 1/09
[52] U.S. Cl. .................................... 324/244; 324/260; 350/96.29; 350/376
[58] Field of Search .................... 324/96, 244, 260; 350/96.29, 96.30, 374–376

[56] References Cited

U.S. PATENT DOCUMENTS 4,442,350  4/1984  Rashleigh .......................... 324/96 X
4,450,406  5/1984  Bobb ................................. 324/244 X

FOREIGN PATENT DOCUMENTS 0898351  1/1982  U.S.S.R. ............................... 324/260

*Primary Examiner*—Gerard R. Strecker
*Attorney, Agent, or Firm*—Kerkam, Stowell, Kondracki & Clarke

[57] ABSTRACT

A magnetic field sensor is comprised by a length of magnetically sensitized single mode optical fibre wound in substantially random directions on a sphere of non-magnetic material, so that an omnidirectional response is obtained. Specific directionality can be obtained by application of a dc bias field in the desired direction. All three perpendicular components can be measured by applying three perpendicular ac fields at different frequencies. The sensor is intended for use in all fibre Mach-Zehnder interferometer types of magnetometer or magnetic gradient detector, examples of which are described.

8 Claims, 4 Drawing Figures

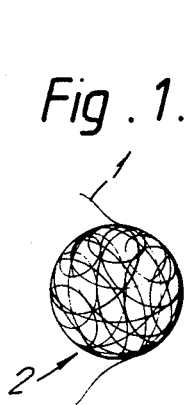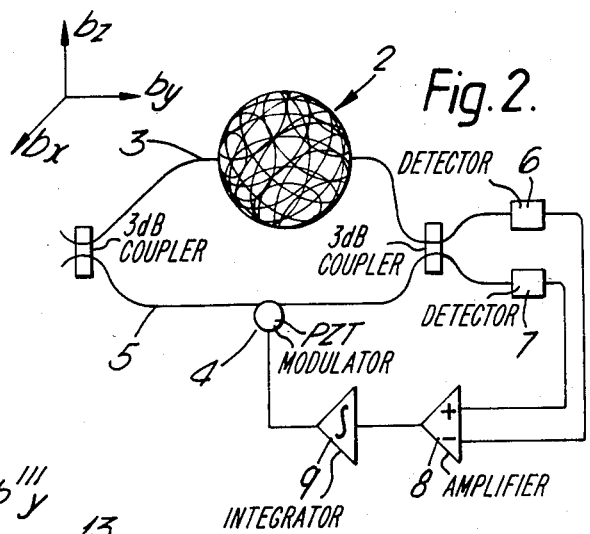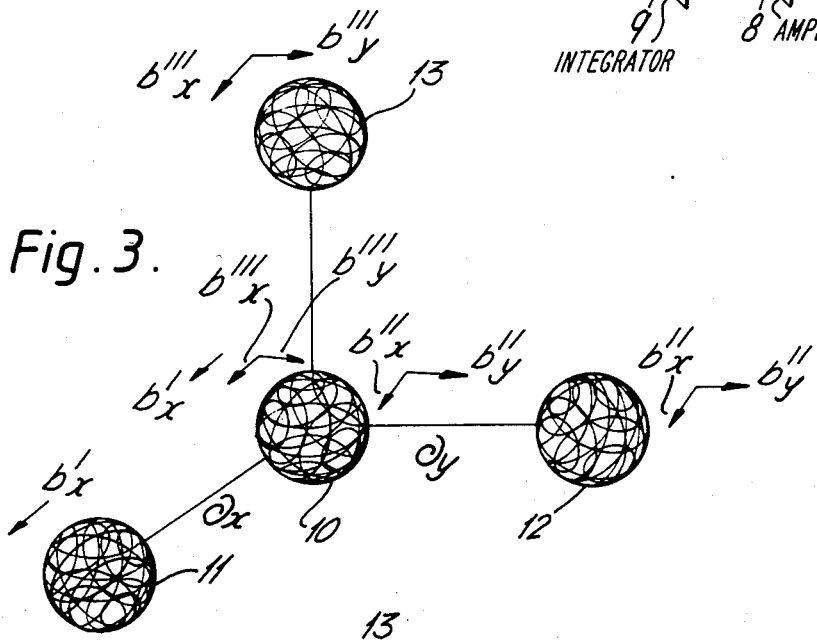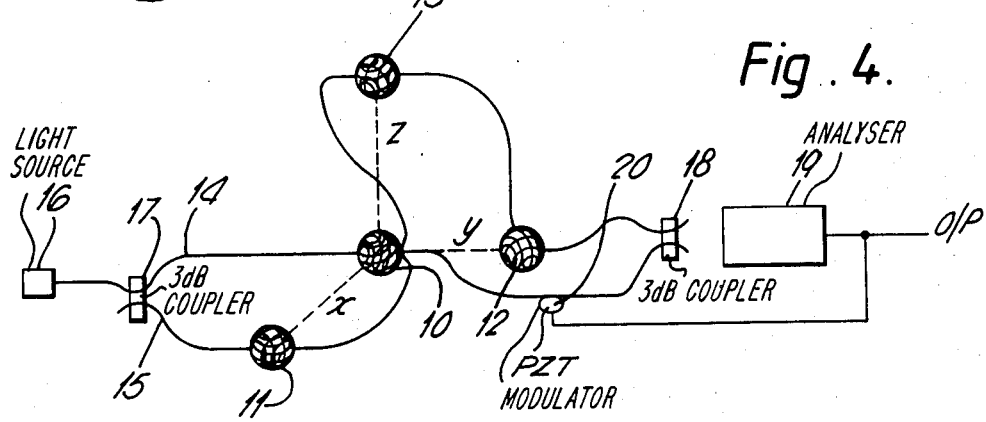

SPHERICAL SHELL FIBRE OPTIC MAGNETIC FIELD SENSORS AND MAGNETOMETERS AND MAGNETIC GRADIENT DETECTORS INCORPORATING THEM

BACKGROUND OF THE INVENTION

This invention relates to magnetic field detection and in particular to fibre optic magnetic field sensors and their use in magnetic gradient detection.

Interferometric fibre optic magnetometers are already known for example from "A fibre-optic dc magnetometer" by K. P. Koo et al. Journal of Lightwave Technology, Vol. LT-1, No. 3, September 1983, P 524–5. They basically comprise an all-fibre Mach-Zehnder interferometer, one arm of which is magnetically sensitised by, for example, being bonded to a strip of magnetostrictive material or coated with a magnetostrictive material. A d.c. magnetic field has the effect of altering the optical path length of the sensitised arm and the interferometer output which is proportional to the differential path length change ($\Delta L$) is thus related to the magnetic field (H), $\Delta L \alpha H^2$. To overcome inaccuracies due to noise etc, an ac bias field at frequency w is applied to the sensitised arm and then the interferometer output at w is directly proportional to the dc magnetic field.

A fibre-optic magnetic gradient detector is described by K. P. Koo et al in the article on pages 509–513 of the Journal of Lightwave Technology, Vol. LT-1, No. 3, September 1983. In this case both arms of the all-fibre Mach-Zehnder interferometer are magnetically sensitised and ac bias fields at the same frequency are applied to both sensitised portions. The detector described in this article only measures the magnetic gradient in one direction, that is between the two arms.

In our co-pending G.B. Application No. 8504729 published under (Ser. No. 2171514A) (p. Extance-R. E. Jones 17-17) there is described a fibre optic magnetic gradient detector which detects two orthogonal magnetic gradient components simultaneously and employs three sensitised optical fibre portions, two in one arm and one in the other arm of an all-fibre Mach-Zehnder interferometer, and ac bias fields at two different frequencies. The sensitised optical fibre portions are wound in the form of planar circular sensing coils, the single mode optical fibre employed being magnetically sensitised by, for example, being coated with a magnetostrictive material.

SUMMARY OF THE INVENTION

According to one aspect of the present invention there is provided a magnetic field sensor comprising a length of magnetically sensitised single mode optical fibre wound in substantially random directions into a spherical shell shape.

According to another aspect of the present invention there is provided a magnetometer comprising an all fibre Mach-Zehnder interferometer in one arm of which is connected a magnetic field sensor comprising a length of magnetically sensitised single mode optical fibre wound in substantially random directions into a spherical shell shape.

BRIEF DESCRIPTION OF THE DRAWINGS

Embodiments of the present invention will now be described with reference to the accompanying drawings, in which:

FIG. 1 illustrates schematically an optical fibre magnetic field sensor structure according to the present invention;

FIG. 2 illustrates schematically an all fibre Mach-Zehnder interferometer magnetometer including a sensor of FIG. 1;

FIG. 3 illustrates the relative arrangement of four sensors of FIG. 1 for a magnetic gradient detector, and FIG. 4 illustrates the arrangement of four sensors of FIG. 3 in a Mach-Zehnder interferometer.

DESCRIPTION OF THE PREFERRED EMBODIMENTS

The optical fibre magnetic field sensor structure illustrated in FIG. 1 comprises a length of magnetically sensitised, for example by being coated with a magnetostrictive material, single mode optical fibre 1 formed into a spherical shell shape 2 by being wound in substantially random directions on a support sphere of non-magnetic material. A magnetic field in any direction will thus cause a length change of the optical fibre that can be detected interferometrically, that is an omnidirectional response is obtained. Specific directionality can be obtained by the application of a d.c. bias field in the desired direction. All three perpendicular components of a magnetic field can be measured by applying three perpendicular (mutually orthogonal) a.c. magnetic bias fields, each at a different frequency, to the spherically wound fibre.

If only the magnitude and direction of the magnetic field is required the interferometer may be arranged as in FIG. 2. The interferometer has a sphere of wound fibre 2 disposed in one arm 3 and is controlled by a PZT phase modulator 4 in the other arm 5 in dependence on the outputs of detectors 6 and 7 which are applied to a differential amplifier 8 followed by an integrator 9. Three a.c. bias fields ($b_x$, $b_y$, $b_z$) at right angles to one another and each at respective different frequencies are required to be generated at the spherically wound fibre 2. This may be achieved by solenoids or Helmholtz coils (omitted for clarity). Each component of the magnetic field to be detected is related to a respective ac bias field frequency and is measured as the amplitude of the respective fundamental frequency at the interferometer output.

For a basic magnetic gradient detector two such spherically wound fibres separated by a predetermined baseline spacing, together with respective ac bias field generating means, are required for one component of the gradient and the differential response of the two spherically wound fibres is measured.

A full description of the gradient of a magnetic field requires the knowledge of the nine components of the gradient tensor:

$$\begin{pmatrix} \dfrac{dB_x}{dx} & \dfrac{dB_x}{dy} & \dfrac{dB_x}{dz} \\ \dfrac{dB_y}{dx} & \dfrac{dB_y}{dy} & \dfrac{dB_y}{dz} \\ \dfrac{dB_z}{dx} & \dfrac{dB_z}{dy} & \dfrac{dB_z}{dz} \end{pmatrix}$$

However, from Maxwells' equations div B=0, therefore $$dB_x/dx + dB_y/dy + dB_z/dz = 0$$

so that only two of these gradients need to be measured to determine all three. Hence there is no need to measure $dB_z/dz$ say. In addition for this system curl B=0, so that the tensor is symmetrical, that is $$dB_x/dz = dB_z/dx,\ dB_y/dx = dB_x/dy,$$
$$dB_z/dy = dB_y/dz$$

Thus only five independent components remain which must be measured in order to determine all nine components, as follows:

$$\begin{pmatrix} \dfrac{dB_x}{dx} & \dfrac{dB_x}{dy} & \dfrac{dB_x}{dz} \\ - & \dfrac{dB_y}{dy} & \dfrac{dB_y}{dz} \\ - & - & - \end{pmatrix}$$

Since it is necessary to measure gradients along all three directions according to this reduced tensor, a minimum of four displaced spherically wound sensors are required (FIG. 3). Bias fields are required in the x and y directions only, as is apparent from the reduced tensor. The central spherically wound optical fibre sensor ("golf-ball") 10 is at the origin of the x, y and z axes, and three "golf-balls" 11, 12 and 13 are spaced apart from the origin in the x, y and z directions respectively by baseline spacings dx, dy and dz, respectively. In order to obtain the $dB_x/dx$ term of the reduced tensor, "golf-balls" 10 and 11 each require the application of the same bias field in the x direction, that is bias field $b_x{}^I$. For the $dB_x/dy$ and $dB_y/dy$ terms, "golf-balls" 10 and 12 each require the application of the same bias fields in the x and y directions, that is bias fields $b_x{}^{II}$ and $b_y{}^{II}$. For the $dB_x/dz$ and $dB_y/dz$ terms, "golf-balls" 10 and 13 each require the application of the same bias field in the x and y directions, that is bias fields $B_x{}^{III}$ and $b_y{}^{III}$. Thus five bias fields, or rather fields at five different frequencies are required.

The four "golf-balls" 10, 11, 12 and 13 of FIG. 3 are disposed correctly with respect to one another in the x, y and z directions and connected in a two arm all fibre Mach-Zehnder interferometer, the "golf-ball" 10 being disposed in one arm 14 and the "golf-balls" 11, 12 and 13 connected in series, but not necessarily in that order, in the other arm 15. Means for providing the five bias fields at their respective frequencies being required for each arm, as indicated in FIG. 4. Light from a source 16 is input to both arms 14 and 15 by means of a 3 dB coupler 17. The output ends of arms 14 and 15 are coupled by means of a 3 dB coupler 18. Since five frequencies are involved use of a spectrum analyser 19 may be preferable to separate detectors. The output of the spectrum analyser is also employed to control the interferometer via a PZT phase modulator 20. Once the five independent magnetic gradients are determined from output of the interferometer, the remaining four terms of the tensor can be calculated.

Preferably the coating of magnetostrictive material on the fibre of the "golf-balls" is less than 100 microns thick. The coating should be as thin as possible to minimise the effect of the inherent demagnetising field but thick enough to minimise the effect of mass loading on magnetostrictive strain.

We claim:

1. A magnetic field sensor with an omnidirectional response comprising a magnetically sensitive spherical shell formed by winding a length of magnetically sensitised single mode optical fibre in substantially random directions to produce a spherical shell shape, the fibre having a coating of a magnetostrictive material serving to magnetically sensitise it, disposition of the sensor in a magnetic field causing a corresponding length change of the optical fibre which can be detected interferometrically.

2. A magnetic field sensor as claimed in claim 1 wherein the fibre is wound onto a sphere of non-magnetic material.

3. A magnetometer comprising an all fibre Mach-Zehnder interferometer in one arm of which is connected a magnetic field sensor comprising a magnetically sensitive spherical shell formed by winding a length of magnetically sensitised single mode fibre in substantially random directions to produce a spherical shell shape, the fibre having a coating of a magnetostrictive material serving to magnetically sensitise it, disposition of the sensor in a magnetic field causing a corresponding length change of the optical fibre in the one arm of the interferometer.

4. A magnetometer as claimed in claim 3 and including, for determining the magnitude and direction of the magnetic field, means for producing three mutually orthogonal ac bias magnetic fields at the sensor, the bias fields having respective different frequencies, and wherein in use each component of the magnetic field is measured as the amplitude of its fundamental frequency in the interferometer output.

5. A magnetometer as claimed in claim 3 and including one said magnetic field sensor in both arms of the interferometer and including, for determining the magnetic gradient between the magnetic field sensors, means for producing three mutually orthogonal a.c. bias magnetic fields at each sensor, the bias fields at one sensor having respective different frequencies and the bias fields at the other sensor having the same respective different frequencies, and wherein in use to determine the magnetic gradient the differential response of the sensors is measured.

6. A magnetic gradient detector comprising four magnetic field sensors as claimed in claim 1, one of said sensors being disposed at the origin of three mutually perpendicular axes, each of the three other sensors being disposed on a respective one of said axes and at a respective predetermined distance from the origin, said one sensor being connected in one arm of an all fibre Mach-Zehnder interferometer, the other sensors being connected in series in the other arm of the interferometer.

7. A magnetic gradient detector as claimed in claim 6 wherein a first on (11) of the three other sensors is disposed on an x axis, a second one (13) of the three other sensors is disposed on a z axis and a third one (12) of the three other sensors is disposed on a y axis, including means for generating a first ac bias magnetic field at a respective frequency in the direction of the x axis at the first sensor, means for generating respective second and third ac bias magnetic fields in the direction of the x and y axes and at respective different frequencies at the second sensor, and means for generating respective fourth and fifth ac bias magnetic fields in the direction of the x and y axes and at respective different frequencies at the third sensor, and means for also generating said first, second, third, fourth and fifth ac bias fields at the sensor at the origin.

8. A magnetic gradient detector as claimed in claim 7 and including spectrum analyser means for differentiating between the outputs of the interferometer at the five different frequencies of the five ac bias fields and means to determine therefrom the five independent components of the nine component magnetic gradient tensor and to calculate the remaining four components thereof.

* * * * *